US011168253B2

United States Patent
Jeon et al.

(10) Patent No.: US 11,168,253 B2
(45) Date of Patent: Nov. 9, 2021

(54) SILICON LAYER ETCHANT COMPOSITION AND METHOD OF FORMING PATTERN BY USING THE SAME (71) Applicant: SAMSUNG ELECTRONICS CO., LTD., Suwon-si (KR)

(72) Inventors: Changsu Jeon, Hwaseong-si (KR); Jungmin Oh, Incheon (KR); Hyosan Lee, Hwaseong-si (KR); Hoon Han, Anyang-si (KR); Jinkyu Roh, Seoul (KR); Hyojoong Yoon, Iksan-si (KR); Dongwun Shin, Daejeon (KR)

(73) Assignees: SAMSUNG ELECTRONICS CO., LTD., Suwon-si (KR); DONGWOO FINE-CHEM CO., LTD., Iksan-si (KR)

(*) Notice: Subject to any disclaimer, the term of this patent is extended or adjusted under 35 U.S.C. 154(b) by 0 days.

(21) Appl. No.: 16/734,789

(22) Filed: Jan. 6, 2020

(65) Prior Publication Data
US 2020/0216757 A1 Jul. 9, 2020

(30) Foreign Application Priority Data

Jan. 8, 2019 (KR) .................. 10-2019-0002488

(51) Int. Cl.
| C09K 13/00 | (2006.01) |
| H01L 21/02 | (2006.01) |
| H01L 21/04 | (2006.01) |
| H01L 21/302 | (2006.01) |
| H01L 21/306 | (2006.01) |
| H01L 21/311 | (2006.01) |
| H01L 21/3213 | (2006.01) |

(52) U.S. Cl.
CPC ........ *C09K 13/00* (2013.01); *H01L 21/02019* (2013.01); *H01L 21/02107* (2013.01); *H01L 21/042* (2013.01); *H01L 21/302* (2013.01); *H01L 21/306* (2013.01); *H01L 21/30604* (2013.01); *H01L 21/30608* (2013.01); *H01L 21/311* (2013.01); *H01L 21/31105* (2013.01); *H01L 21/31111* (2013.01)

(58) Field of Classification Search
None
See application file for complete search history.

(56) References Cited

U.S. PATENT DOCUMENTS

| 8,415,254 | B2 | 4/2013 | Yeh et al. |
| 8,883,652 | B2 * | 11/2014 | Yaguchi ............... B81C 1/00539 438/745 |

(Continued)

FOREIGN PATENT DOCUMENTS

| EP | 1626438 B1 | 3/2013 |
| JP | 2009-123798 A | 6/2009 |

(Continued)

*Primary Examiner* — Stephanie P Duclair
(74) *Attorney, Agent, or Firm* — Lee IP Law, P.C.

(57) ABSTRACT

A silicon layer etchant composition and associated methods, the composition including about 1 wt % to about 20 wt % of an alkylammonium hydroxide; about 1 wt % to about 30 wt % of an amine compound; about 0.01 wt % to about 0.2 wt % of a nonionic surfactant including both a hydrophobic group and a hydrophilic group; and water, all wt % being based on a total weight of the silicon layer etchant composition.

4 Claims, 3 Drawing Sheets

(56) References Cited

U.S. PATENT DOCUMENTS

| | | | |
|---|---|---|---|
| 9,023,708 B2 | 5/2015 | Chen et al. | |
| 9,972,696 B2 | 5/2018 | Kim et al. | |
| 10,179,878 B2 | 1/2019 | Yang et al. | |
| 2009/0001315 A1* | 1/2009 | Ishikawa | H01L 21/02074 |
| | | | 252/79.5 |
| 2009/0218542 A1 | 9/2009 | Isami et al. | |
| 2009/0227115 A1* | 9/2009 | Kato | H01L 21/30604 |
| | | | 438/753 |
| 2014/0001145 A1* | 1/2014 | Mizutani | H01L 21/02068 |
| | | | 216/6 |
| 2017/0145311 A1 | 5/2017 | Liu et al. | |
| 2019/0085240 A1 | 3/2019 | Liu et al. | |

FOREIGN PATENT DOCUMENTS

| | | | | |
|---|---|---|---|---|
| KR | 95-19927 | | 7/1995 | |
| KR | 10-2018-0010483 | | 1/2018 | |
| KR | 10-2018-0026855 | | 3/2018 | |
| KR | 10-2018-0047816 | | 5/2018 | |
| WO | 2013100318 | * | 7/2013 | H01L 21/304 |

* cited by examiner

SILICON LAYER ETCHANT COMPOSITION AND METHOD OF FORMING PATTERN BY USING THE SAME

CROSS-REFERENCE TO RELATED APPLICATION

Korean Patent Application No. 10-2019-0002488, filed on Jan. 8, 2019, in the Korean Intellectual Property Office, and entitled: "Silicon Layer Etchant Composition and Method of Forming Pattern by Using the Same," is incorporated by reference herein in its entirety.

BACKGROUND

1. Field

Embodiments relate to a silicon layer etchant composition and a method of forming a pattern by using the silicon layer etchant composition.

2. Description of the Related Art

In semiconductor devices such as dynamic random-access memory (DRAM), NAND flash memory devices, and the like, while critical dimensions (CDs) have reduced sharply recently, development to implement large capacity has continued.

In such semiconductor devices, e.g., layers or patterns, which are based on silicon such as polysilicon, may be used as materials of gate electrodes, capacitor electrodes, conductive contacts, wiring lines, and the like.

SUMMARY

The embodiments may be realized by providing a silicon layer etchant composition including about 1 wt % to about 20 wt % of an alkylammonium hydroxide; about 1 wt % to about 30 wt % of an amine compound; about 0.01 wt % to about 0.2 wt % of a nonionic surfactant including both a hydrophobic group and a hydrophilic group; and water, all wt % being based on a total weight of the silicon layer etchant composition.

The embodiments may be realized by providing a method of forming a pattern, the method including forming a dummy gate by etching a silicon layer on a substrate; forming an insulating layer to partially surround the dummy gate; removing the dummy gate by using the silicon layer etchant composition according to an embodiment; and forming a gate structure in an opening obtained by the removing of the dummy gate.

The embodiments may be realized by providing a method of preparing the silicon layer etchant composition according to an embodiment, the method including preparing an additive mixture by mixing the amine compound with the nonionic surfactant including both a hydrophobic group and a hydrophilic group; and mixing the additive mixture with an aqueous solution of the alkylammonium hydroxide.

The embodiments may be realized by providing a method of forming a pattern, the method including forming a dummy gate by etching a silicon layer on a substrate; forming an insulating layer to partially surround the dummy gate; removing the dummy gate by using an etchant composition that includes an alkylammonium hydroxide, an amine compound, a nonionic surfactant including both a hydrophobic group and a hydrophilic group, and water; and forming a gate structure in an opening obtained by the removing of the dummy gate.

The embodiments may be realized by providing an additive mixture for a silicon layer etchant, the additive mixture including an amine compound; and a nonionic surfactant including both a hydrophobic group and a hydrophilic group.

The embodiments may be realized by providing a method of preparing a silicon layer etchant composition, the method including preparing the additive mixture according to an embodiment by mixing the amine compound with the nonionic surfactant including both a hydrophobic group and a hydrophilic group; and mixing the additive mixture with an alkylammonium hydroxide aqueous solution.

The embodiments may be realized by providing a method of preparing a silicon layer etchant composition, the method including preparing an additive mixture by mixing an amine compound with a nonionic surfactant including both a hydrophobic group and a hydrophilic group; and mixing the additive mixture with an alkylammonium hydroxide aqueous solution.

BRIEF DESCRIPTION OF THE DRAWINGS

Features will be apparent to those of skill in the art by describing in detail exemplary embodiments with reference to the attached drawings in which.

DETAILED DESCRIPTION

In an implementation, an etchant composition may include, e.g., an alkylammonium hydroxide, an amine compound, and a nonionic surfactant.

As used herein, the term "silicon layer" may refer to a layer including polysilicon or amorphous silicon.

Hereinafter, embodiments will be described in detail.

<Silicon Layer Etchant Composition>

The silicon layer etchant composition (which may be briefly referred to as an etchant composition hereinafter) according to example embodiments may include, e.g., an alkylammonium hydroxide, an amine compound, a nonionic surfactant, and water (e.g., a balance amount of water).

The alkylammonium hydroxide may be included as a main etching agent for removing a silicon layer by dissociating hydroxide ions. In an implementation, the alkylammonium hydroxide may include a quaternary alkylammonium hydroxide represented by Chemical Formula 1.

[Chemical Formula 1]

In Chemical Formula 1, $R_1$, $R_2$, $R_3$ and $R_4$ may each independently be, e.g., a C1 to C8 alkyl group or C6 to C8 aryl group. In an implementation, $R_1$, $R_2$, $R_3$ and $R_4$ may each independently be, e.g., a C1 to C4 alkyl group. In an implementation, at least one of $R_1$, $R_2$, $R_3$ and $R_4$ may be, e.g., a C1 to C8 alkyl group. If the carbon number of each of $R_1$, $R_2$, $R_3$ and $R_4$ were to be excessively increased, the dissociation of hydroxide ions could be inhibited due to steric hindrance.

In an implementation, the alkylammonium hydroxide may include, e.g., tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, methyltributylammonium hydroxide, or the like. The alkylammonium hydroxide may be used alone or in combination.

In an implementation, the alkylammonium hydroxide may be present in an amount of, e.g., about 1 wt % to about 20 wt %, based on a total weight of the etchant composition. Within this range, a degree of dissociation of hydroxide ions, or an amount of hydroxide ions dissociated from the etchant composition may be secured, and a sufficient etching capability may be achieved. In an implementation, the alkylammonium hydroxide may be present in an amount of, e.g. about 3 wt % to about 17 wt % based on the total weight of the etchant composition.

The amine compound may help adjust or maintain a pH of the etchant composition, and may be added as an etching accelerator. For example, the amine compound may help accelerate the dissociation or generation of hydroxide ions in the etchant composition and may help improve the hydrophilization or wettability of a silicon layer. In addition, the amine compound may help accelerate the removal of surface hydrogen gas generated during the etching of the silicon layer.

In an implementation, the amine compound may include, e.g., 1-amino-2-propanol, 2-amino-1-butanol, 3-amino-1-propanol, 3-amino-1,2-propanediol, 2,3-butanediol, diethylenetriamine, isopropylamine, methyldiethanolamine, triethylamine, trimethylamine, methylamine, ethylamine, propanolamine, ethanolamine, aniline, 2-aminopentane, diethylamine, diethanolamine, N-methylethanolamine, N-methyldiethanolamine, 2-amino-3-methyl-1-butanol, 3-amino-2,2-dimethyl-1-propanol, tris(hydroxymethyl)aminomethane, 2-amino-2-methyl-1,3-propanediol, 3-methylamino-1-propanol, 2-dimethylamino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)-2-propanol, diethanolamine, N-propyldiethanolamine, N-isopropyldiethanolamine, N-(2-methylpropyl)diethanolamine, N-n-butyldiethanolamine, N-t-butylethanolamine, N-cyclohexyldiethanolamine, N-dodecyldiethylamine, 2-(dimethylamino)ethanol, 2-diethylaminoethanol, 2-dipropylaminoethanol, 2-butylaminoethanol, 2-t-butylaminoethanol, 2-cycloaminoethanol, 2-amino-2-pentanol, 2-[bis(2-hydroxyethyl)amino]-2-methyl-1-propanol, 2-[bis(2-hydroxyethyl)amino]-2-propanol, N,N-bis(2-hydroxypropyl)ethanolamine, 2-amino-2-methyl-1-propanol, tris(hydroxymethyl)aminomethane, triisopropanolamine, trimethylpyridine, dimethylpyridine, or the like. These amine compounds may be used alone or in combination.

In an implementation, the amine compound may include, e.g., a hydroxyl group-containing amine compound (e.g., an alkanolamine compound).

In an implementation, the amine compound may be present in an amount of, e.g., about 1 wt % to about 30 wt % based on the total weight of the etchant composition. Maintaining the amount of the amine compound at about 1 wt % or greater may help ensure that sufficient effects of etching acceleration and gas removal are achieved. Maintaining the amount of the amine compound at about 30 wt % or less may help ensure that the amine compound is not excessively adsorbed onto the silicon layer, thereby preventing a deterioration of an etch rate.

The nonionic surfactant may help reduce the surface tension of the silicon layer and may help suppress foam or bubbles generated in an etching process.

In an implementation, the nonionic surfactant may have a structure in which a hydrophilic group and a hydrophobic group are bonded.

The hydrophilic group may help improve the penetrability of the nonionic surfactant in the etchant composition. For example, as the nonionic surfactant is adsorbed onto a silicon layer surface, the penetration of hydroxide ions may be simultaneously accelerated by the hydrophilic group.

The hydrophilic group may have a molecular weight that is relatively greater than that of the hydrophobic group, and overall affinity to the etchant composition may be improved by the hydrophilic group. In an implementation, the hydrophilic group may include, e.g., a polyoxyalkylene, a polyhydroxy alcohol, an ammonium fluoroalkylsulfonamide, or the like. In an implementation, the hydrophilic group may include, e.g., a polyoxyalkylene.

In an implementation, the number of repetitions of an alkyl oxide included in a polyoxyalkylene structure may be 2 to 8 (e.g., the polyoxyalkylene group may include 2 to 8 alkyl oxide moieties). Within this range, excessive steric hindrance and an excessive increase in molecular weight may be prevented and a sufficient interaction with the etchant composition may be easily secured.

The hydrophobic group may help accelerate the adsorption onto the silicon layer surface and may remove or desorb foam or bubbles generated in an etching process. To help improve the adsorption onto the silicon layer surface, the hydrophobic group may have a relatively lower molecular-weight structure, as compared with the hydrophilic group.

In an implementation, the hydrophobic group may include, e.g., an aliphatic or aromatic hydrocarbon group. In an implementation, the hydrophobic group may include, e.g., a cyclic structure. For example, to help improve the penetrability of the nonionic surfactant to a space between patterns around the silicon layer, the hydrophobic group may include an alicyclic ring or an aromatic ring. In an implementation, the hydrophobic group may include, e.g., an aromatic ring.

In an implementation, the hydrophobic group may include, e.g., a propyl group, an isopropyl group, a butyl group, an isobutyl group, a sec-butyl group, a tert-butyl group, a phenyl group, a naphthyl group, an ethylhexyl group, a decyl group, a lauryl group, an isotridecyl group, a cetyl group, an oleyl group, a stearyl group, an alkylphenyl group (methylphenyl or octylphenyl group), or the like.

In an implementation, the hydrophobic group may have, e.g., a C3 to C18 structure. In an implementation, the hydrophobic group may have, e.g., a C3 to C10 structure. Within this range, the removal of foam or bubbles through adsorption/desorption of the hydrophobic group may be further improved.

In an implementation, the hydrophilic group may be connected to the hydrophobic group via an ether bond (—O—).

In an implementation, the nonionic surfactant may be present in an amount of, e.g., about 0.01 wt % to about 0.2 wt % based on the total weight of the etchant composition. Maintaining the amount of the nonionic surfactant at about 0.01 wt % or greater may help ensure that a sufficient effect of removing foam or bubbles is achieved. Maintaining the amount of the nonionic surfactant at about 0.2 wt % or less may help ensure that an effect of reducing surface tension is maintained without deteriorating an etch rate.

The etchant composition may include water, e.g., a remaining amount or balance amount of water (e.g., deionized water). As used herein, the term "remaining amount" or "balance amount" may refer to a variable amount which varies depending upon the addition of a component or agent. For example, the term "remaining amount" or "balance amount" may refer to a remaining amount except for the respective amounts of the alkylammonium hydroxide, the amine compound, and the nonionic surfactant, which have been described above, or a remaining amount except for the respective amounts of the alkylammonium hydroxide, the amine compound, the nonionic surfactant, and other additives.

In an implementation, the etchant composition may further include an additive that does not inhibit the etching capability, the surface tension reduction effect, the bubble removal effect, and the like provided by the alkylammonium hydroxide, the amine compound, and the nonionic surfactant. In an implementation, the additive may include, e.g., an etching accelerator, a corrosion inhibitor, a pH control agent, or the like.

In an implementation, the pH of the etchant composition may be adjusted to a range of, e.g., about 11 to about 14. Within this pH range, damage to other insulating structures, semiconductor patterns, substrates, or the like (except for the silicon layer, which is an etching target layer) may be suppressed.

In an implementation, the etchant composition may be prepared as a 2-liquid type composition. For example, a preliminary etchant composition or an additive mixture for a silicon layer etchant may be prepared by mixing the amine compound and the nonionic surfactant. The preliminary etchant composition or the additive mixture for a silicon layer etchant may then be mixed with an alkylammonium hydroxide aqueous solution. For example, the etchant composition having a target composition may be prepared from the preliminary etchant composition which is relatively concentrated.

As the etchant composition is prepared in the manner of the 2-liquid type set forth above, the amine compound and the nonionic surfactant may be mixed with each other and stabilized in advance. For example, the inhibition of activity, which could otherwise occur due to the amine compound and the nonionic surfactant being brought into contact with the alkylammonium hydroxide in advance, may be prevented.

As described above, in the etchant composition according to example embodiments, the etch rate of the silicon layer may be increased through an interaction between the alkylammonium hydroxide and the amine compound, and a reduction in surface tension and an improvement of wettability may be achieved through an interaction between the nonionic surfactant and the amine compound. For example, poor etching due to foam or bubbles on the silicon layer surface may be prevented and both the high etch rate and etch uniformity may be achieved.

<Pattern Forming Method>

FIGS. 1 to 5 illustrate schematic cross-sectional views of stages in a method of forming a pattern, according to example embodiments. In an implementation, as illustrated in FIGS. 1 to 5, a semiconductor logic device may include a poly-replacement gate or gate-last process using a silicon layer.

In an implementation, the etchant composition may be used for processes of forming various structures or patterns, e.g., wiring lines, contacts, and gates.

Figure 1:
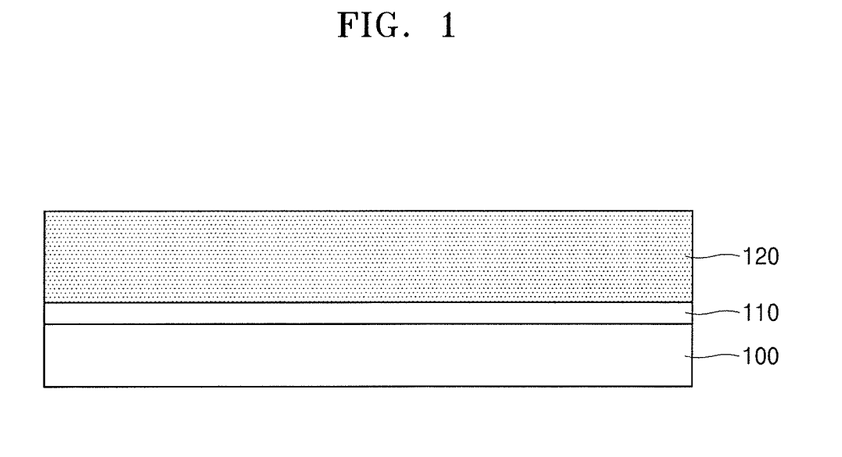
FIGS. 1 to 5 illustrate schematic cross-sectional views of stages in a method of forming a pattern, according to example embodiments.

Referring to FIG. 1, a gate insulating layer 110 and a dummy gate layer 120 may be sequentially formed on a substrate 100 in this stated order.

The substrate 100 may include a semiconductor material, e.g., single-crystal silicon, single-crystal germanium, or a Group III-V compound.

The gate insulating layer 110 may include, e.g., silicon oxide, a high-k metal oxide, or the like. The dummy gate layer 120 may include, e.g., polysilicon or amorphous silicon. In an implementation, the gate insulating layer 110 may be formed by a chemical vapor deposition (CVD) process, a sputtering process, a physical vapor deposition (PVD) process, an atomic layer deposition (ALD) process, or the like.

Figure 2:
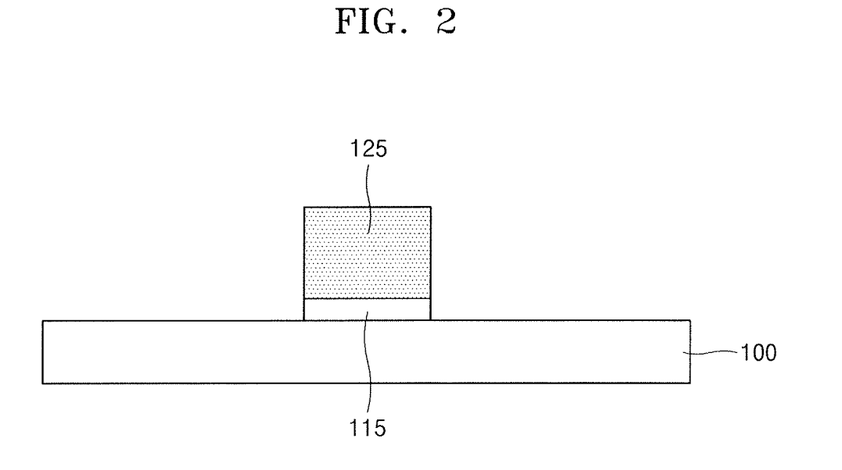

Referring to FIG. 2, a dummy gate 125 and a gate insulating pattern 115 may be formed by partially etching the dummy gate layer 120 and the gate insulating layer 110.

For example, a hardmask or photoresist pattern may be formed on the dummy gate layer 120. The dummy gate 125 and the gate insulating pattern 115 may be formed by a dry etching process using the hardmask or photoresist pattern as an etch mask.

Figure 3:
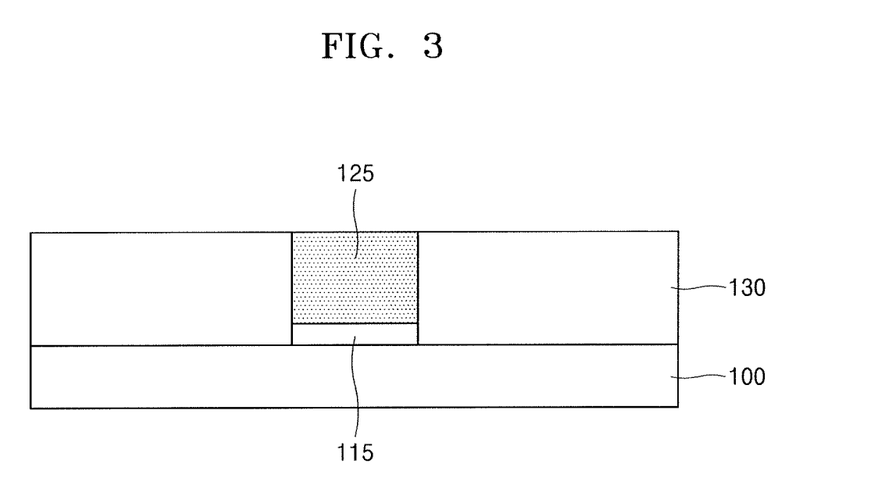

Referring to FIG. 3, an insulating layer 130 may be formed on the substrate 100 such that a top surface of the dummy gate 125 is exposed. For example, an insulating material including silicon oxide, silicon nitride, silicon oxynitride, polysiloxane, or the like may be deposited, followed by planarizing the insulating material through a chemical mechanical polishing (CMP) process such that the top surface of the dummy gate 125 is exposed, thereby forming the insulating layer 130.

Figure 4:
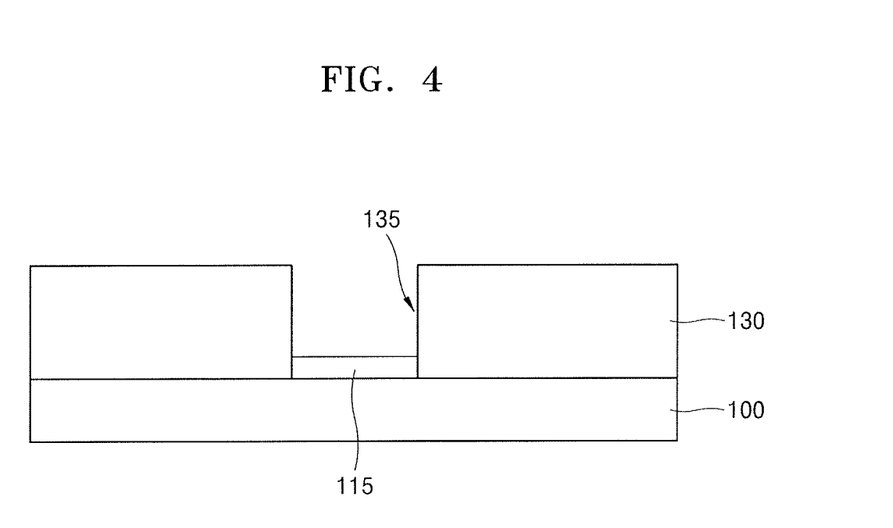

Referring to FIG. 4, the dummy gate 125 may be removed by using the aforementioned etchant composition according to example embodiments. An opening 135 may be formed in a space obtained by removing the dummy gate 125.

As described above, the etchant composition may have an improved etch rate of the silicon layer through an interaction between the alkylammonium hydroxide and the amine compound and may help prevent the generation of foam or bubbles on the silicon layer surface through an interaction between the nonionic surfactant and the amine compound. For example, the dummy gate 125 having a nanoscale size may be removed without etching defects.

Figure 5:
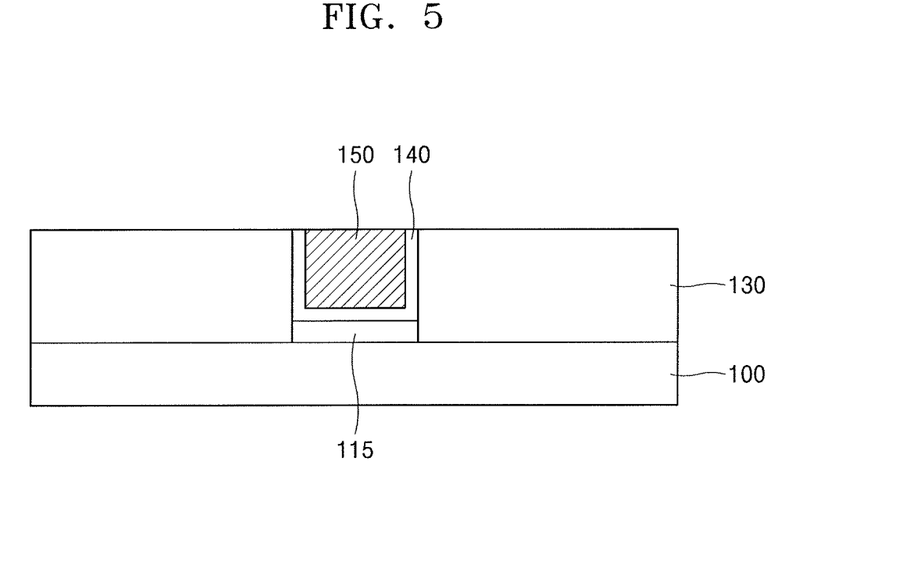

Referring to FIG. 5, a gate structure may be formed in the opening 135.

For example, a barrier layer including a metal nitride (e.g., titanium nitride or tantalum nitride) and a gate metal layer including a metal (e.g., tungsten, cobalt, or copper) may be formed on the insulating layer 130 to fill the opening 135. Next, the gate metal layer and the barrier layer may be planarized through a CMP process such that a top surface of the insulating layer 130 is exposed, thereby forming the gate structure including a barrier pattern 140 and a metal gate 150.

In an implementation, referring again to FIG. 4, after the dummy gate 125 is removed, the gate insulating pattern 115 may also be removed. In this case, the gate insulating pattern 115 may be provided as a dummy gate insulating layer. Next, before the gate structure is formed in the opening 135, a gate insulating layer may be formed again.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Components were mixed according to amounts (wt %) as listed in Table 1 (Examples) and Table 2 (Comparative Examples), and a balance amount of water was commonly added, thereby preparing an etchant composition of each of Examples and Comparative Examples.

TABLE 1

| | Alkylammonium hydroxide | Nonionic surfactant | | | | | | | Amine compound |
|---|---|---|---|---|---|---|---|---|---|
| | | B-1 | B-2 | B-3 | B-4 | B-5 | B-6 | B-7 | |
| Example 1 | 8.4 (A-1) | 0.09 | | | | | | | 17.2 (C-1) |
| Example 2 | 8.4 (A-1) | 0.09 | | | | | | | 11.4 (C-2) |
| Example 3 | 8.4 (A-1) | 0.09 | | | | | | | 21.7 (C-3) |
| Example 4 | 15.6 (A-1) | | 0.08 | | | | | | 17.2 (C-1) |
| Example 5 | 15.6 (A-1) | | 0.08 | | | | | | 11.4 (C-2) |
| Example 6 | 15.6 (A-1) | | 0.08 | | | | | | 21.7 (C-3) |
| Example 7 | 3.2 (A-1) | | | 0.13 | | | | | 17.2 (C-1) |
| Example 8 | 3.2 (A-1) | | | 0.13 | | | | | 11.4 (C-2) |
| Example 9 | 3.2 (A-1) | | | 0.13 | | | | | 21.7 (C-3) |
| Example 10 | 16.8 (A-1) | | | | 0.16 | | | | 17.2 (C-1) |
| Example 11 | 16.8 (A-1) | | | | 0.16 | | | | 11.4 (C-2) |
| Example 12 | 16.8 (A-1) | | | | 0.16 | | | | 21.7 (C-3) |
| Example 13 | 8.1 (A-1) | | | | | 0.03 | | | 17.2 (C-1) |
| Example 14 | 8.1 (A-1) | | | | | 0.03 | | | 11.4 (C-2) |
| Example 15 | 8.1 (A-1) | | | | | 0.03 | | | 21.7 (C-3) |
| Example 16 | 1 (A-1) | | 0.08 | | | | | | 17.2 (C-1) |
| Example 17 | 10 (A-1) | | 0.08 | | | | | | 17.2 (C-1) |
| Example 18 | 20 (A-1) | | 0.08 | | | | | | 17.2 (C-1) |
| Example 19 | 15.6 (A-1) | | 0.01 | | | | | | 17.2 (C-1) |
| Example 20 | 15.6 (A-1) | | 0.10 | | | | | | 17.2 (C-1) |
| Example 21 | 15.6 (A-1) | | 0.20 | | | | | | 17.2 (C-1) |
| Example 22 | 15.6 (A-1) | | 0.08 | | | | | | 1 (C-1) |
| Example 23 | 15.6 (A-1) | | 0.08 | | | | | | 10 (C-1) |
| Example 24 | 15.6 (A-1) | | 0.08 | | | | | | 20 (C-1) |
| Example 25 | 15.6 (A-1) | | 0.08 | | | | | | 30 (C-1) |
| Example 26 | 15.6 (A-2) | | 0.08 | | | | | | 17.2 (C-1) |
| Example 27 | 15.6 (A-3) | | 0.08 | | | | | | 17.2 (C-1) |
| Example 28 | 15.6 (A-4) | | 0.08 | | | | | | 17.2 (C-1) |
| Example 29 | 14.3 (A-1) | | | | | | 0.15 | | 17.2 (C-1) |
| Example 30 | 10.1 (A-1) | | | | | | | 0.12 | 17.2 (C-1) |
| Example 31 | 15.6 (A-1) | | 0.08 | | | | | | 12.0 (C-4) |
| Example 32 | 15.6 (A-1) | | 0.08 | | | | | | 8.7 (C-5) |

TABLE 2

| | Alkylammonium hydroxide | Surfactant | | | Amine compound |
|---|---|---|---|---|---|
| | | B-2 | B-8 | B-9 | |
| Comparative Example 1 | 0.1 (A-1) | 0.08 | — | — | 17.2 (C-1) |
| Comparative Example 2 | 0.5 (A-1) | 0.08 | — | — | 17.2 (C-1) |
| Comparative Example 3 | 21 (A-1) | 0.08 | — | — | 17.2 (C-1) |
| Comparative Example 4 | 25 (A-1) | 0.08 | — | — | 17.2 (C-1) |
| Comparative Example 5 | 15.6 (A-1) | 0.005 | — | — | 17.2 (C-1) |
| Comparative Example 6 | 15.6 (A-1) | 0.25 | — | — | 17.2 (C-1) |
| Comparative Example 7 | 15.6 (A-1) | 0.08 | — | — | 0.5 (C-1) |
| Comparative Example 8 | 15.6 (A-1) | 0.08 | — | — | 31 (C-1) |
| Comparative Example 9 | 15.6 (A-1) | 0.08 | — | — | 35 (C-1) |
| Comparative Example 10 | 15.6 (A-1) | — | — | — | — |
| Comparative Example 11 | — | 0.08 | — | — | — |
| Comparative Example 12 | — | — | — | — | 17.2 (C-1) |
| Comparative Example 13 | 15.6 (A-1) | 0.08 | — | — | — |
| Comparative Example 14 | 15.6 (A-1) | — | — | — | 17.2 (C-1) |
| Comparative Example 15 | — | 0.08 | — | — | 17.2 (C-1) |
| Comparative Example 16 | 15.6 (A-1) | — | 0.08 | — | 17.2 (C-1) |
| Comparative Example 17 | 15.6 (A-1) | — | — | 0.08 | 17.2 (C-1) |

Components employed in Table 1 and Table 2 are as follows.

A-1) Tetramethylammonium hydroxide
A-2) Tetraethylammonium hydroxide
A-3) Tetrapropylammonium hydroxide
A-4) Tetrabutylammonium hydroxide
B-1) Polyoxyethylene phenyl ether, n=2 alkyl oxide moieties
B-2) Polyoxyethylene phenyl ether, n=4 alkyl oxide moieties B-3) Polyoxyethylene beta-naphthyl ether
B-4) Polyoxyethylene 2-ethylhexyl ether
B-5) Polyoxyethylene decyl ether
B-6) Polyoxyethylene lauryl ether
B-7) Polyoxyethylene oleyl ether
B-8) Sodium lauryl sulfate
B-9) Lauryltrimethylammonium bromide
C-1) 1-Amino-2-propanol
C-2) 2-Amino-1-butanol
C-3) N-Methylethanolamine
C-4) Diethylenetriamine
C-5) Triethanolamine Experimental Examples 1) Evaluation of Surface Bubbles Samples were prepared by cutting a silicon wafer, on which a polysilicon layer was formed with a thickness of 1,900 Å, into a size of 1.5 cm×1.5 cm and immersed in the etchant compositions of respective ones of Examples and Comparative Examples for 1 minutes. Here, surface bubbles generated on the polysilicon layer were observed and evaluated as follows.

<Evaluation Criteria>
⊚: Bubble-covered area that is equal to or less than 1%, based on a surface area of the polysilicon layer
○: Bubble-covered area that is greater than 1% and equal to or less than 10%
Δ: Bubble-covered area that is greater than 10% and equal to or less than 20%
x: Bubble-covered area that is greater than 20%

2) Evaluation of Wettability of Polysilicon Layer

A contact angle (C/A) of the etchant compositions of each of Examples and Comparative Examples with respect to a surface of the polysilicon layer was measured, thereby evaluating wettability. Evaluation criteria are as follows.

<Evaluation Criteria>
⊚: C/A that is equal to or less than 10°
○: C/A that is greater than 10° and equal to or less than 20°
Δ: C/A that is greater than 20° and equal to or less than 30°
x: C/A that is greater than 30°

3) Evaluation of Etch Rate of Polysilicon Layer

Silicon wafers, on which a polysilicon layer was deposited with a thickness of 1,900 Å, were cut into a size of 1.5 cm×1.5 cm, thereby preparing specimens. The specimens were immersed in a bath, in which the etchant composition of respective ones of of Examples and Comparative Examples were contained, for 10 seconds under conditions of 70° C. and 400 rpm. Next, the specimens were taken out of the bath, cleaned with water, and air-dried, followed by measuring a thickness of the polysilicon layer by using a scanning electron microscope (SEM), and then, the etch rate of the polysilicon layer was calculated by calculating a thickness change from an initial thickness of the polysilicon layer.

<Evaluation Criteria>
⊚: Etch rate that is equal to or greater than 3,500 Å/min
○: Etch rate that is less than 3,500 Å/min and equal to or greater than 2,500 Å/min
Δ: Etch rate that is less than 2,500 Å/min and equal to or greater than 1,500 Å/min
x: Etch rate that is less than 1,500 Å/min 4) Evaluation of Foam-Breaking Rate Foam was artificially generated from the etchant compositions of each of Examples and Comparative Examples for 10 seconds by using a bubble generator, followed by checking a foam-breaking tendency. Evaluation criteria are as follows.

<Evaluation Criteria>
⊚: Foam-breaking rate that is equal to or greater than 5%/sec
○: Foam-breaking rate that is less than 5%/sec and equal to or greater than 3%/sec
Δ: Foam-breaking rate that is less than 3%/sec and equal to or greater than 1%/sec
x: Foam-breaking rate that is less than 1%/sec Evaluation results are shown in Table 3 and Table 4.

TABLE 3

| | Surface bubbles | Wettability | Etch rate | Foam-breaking rate |
|---|---|---|---|---|
| Example 1 | ○ | ○ | ⊚ | ⊚ |
| Example 2 | ○ | ○ | ⊚ | ⊚ |
| Example 3 | ○ | ○ | ⊚ | ⊚ |
| Example 4 | ⊚ | ⊚ | ⊚ | ⊚ |
| Example 5 | ○ | ⊚ | ⊚ | ⊚ |
| Example 6 | ○ | ○ | ⊚ | ⊚ |
| Example 7 | ⊚ | ○ | ○ | ○ |
| Example 8 | ⊚ | ○ | ○ | ○ |
| Example 9 | ⊚ | ○ | ○ | ○ |
| Example 10 | ○ | ○ | ○ | Δ |
| Example 11 | ○ | ○ | ○ | Δ |
| Example 12 | ○ | ○ | ○ | Δ |
| Example 13 | Δ | ○ | ○ | Δ |
| Example 14 | Δ | ○ | ○ | Δ |
| Example 15 | Δ | ○ | ○ | Δ |
| Example 16 | ⊚ | Δ | Δ | ⊚ |
| Example 17 | ⊚ | ⊚ | ⊚ | ⊚ |
| Example 18 | ⊚ | ⊚ | Δ | ⊚ |
| Example 19 | Δ | Δ | ⊚ | ⊚ |
| Example 20 | ⊚ | ⊚ | ○ | ⊚ |
| Example 21 | ⊚ | ⊚ | Δ | ○ |
| Example 22 | Δ | Δ | ○ | ⊚ |
| Example 23 | ○ | ○ | ○ | ⊚ |
| Example 24 | ⊚ | ⊚ | ⊚ | ⊚ |
| Example 25 | ⊚ | ⊚ | Δ | ⊚ |
| Example 26 | ⊚ | ⊚ | ○ | ⊚ |
| Example 27 | ⊚ | ⊚ | Δ | ⊚ |
| Example 28 | ⊚ | ⊚ | Δ | ⊚ |
| Example 29 | Δ | ⊚ | Δ | Δ |
| Example 30 | Δ | ⊚ | Δ | Δ |
| Example 31 | Δ | ⊚ | Δ | Δ |
| Example 32 | Δ | ⊚ | Δ | Δ |

TABLE 4

| | Surface bubbles | Wettability | Etch rate | Foam-breaking rate |
|---|---|---|---|---|
| Comparative Example 1 | ⊚ | Δ | X | ⊚ |
| Comparative Example 2 | ⊚ | Δ | X | ⊚ |
| Comparative Example 3 | ⊚ | ⊚ | X | ⊚ |
| Comparative Example 4 | ⊚ | ⊚ | X | ⊚ |
| Comparative Example 5 | X | ○ | ⊚ | ⊚ |
| Comparative Example 6 | ⊚ | ⊚ | X | X |
| Comparative Example 7 | Δ | X | ○ | ⊚ |
| Comparative Example 8 | ⊚ | ⊚ | X | ⊚ |
| Comparative Example 9 | ⊚ | ⊚ | X | ⊚ |
| Comparative Example 10 | X | X | ⊚ | ⊚ |
| Comparative | ⊚ | Δ | X | ⊚ |

TABLE 4-continued

| | Surface bubbles | Wettability | Etch rate | Foam-breaking rate |
|---|---|---|---|---|
| Example 11 | | | | |
| Comparative Example 12 | ○ | ○ | Δ | ◎ |
| Comparative Example 13 | Δ | X | ○ | ◎ |
| Comparative Example 14 | X | Δ | ◎ | ◎ |
| Comparative Example 15 | X | X | X | ◎ |
| Comparative Example 16 | Δ | Δ | Δ | Δ |
| Comparative Example 17 | Δ | Δ | Δ | Δ |

Referring to Tables 3 and 4, the etchant composition of the Examples (including the components and amounts described above) maintained an improved etch rate with respect to the polysilicon layer on the whole and efficiently suppressed surface bubbles and foam.

When the etchant compositions of Examples 1 to 9 were compared with those of Examples 10 to 15, the etchant compositions in the cases where the hydrophobic group of the nonionic surfactant included an aromatic ring exhibited better effects of bubble removal and foam-breaking.

The etchant compositions of Examples 29 and 30, in which the carbon number of the hydrophobic group was somewhat increased (the carbon number was greater than 10), exhibited a somewhat deteriorated effect of foam-breaking.

By way of summation and review, when gate electrodes or wiring lines have been formed by direct etching of metal layers, the formation of patterns having intended fine sizes may not be easy due to the limit in etch resolution, and processes using polysilicon layers have been considered.

When high-reliability semiconductor device processes are intended to be performed, process yield or dimension reliability could deteriorate due to fine-sized impurities or process by-products. For example, etch uniformity could deteriorate due to bubbles generated from etchants when etching processes are performed.

For example, when silicon layer etching processes are performed, an etchant composition may help improve an etch rate while maintaining etch stability and reliability for forming fine-sized patterns.

For example, some polysilicon layer etchants may include ammonium hydroxide, and component adjustment for stably forming fine-sized patterns may be considered.

One or more embodiments may provide a silicon layer etchant composition exhibiting improved etch stability and etch rates.

Embodiments provide an etchant composition, which may have improved stability and efficiency and is able to etch a silicon layer.

In addition, embodiments may provide a method of forming a pattern by using the etchant composition set forth above.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A silicon layer etchant composition, comprising:
about 1 wt % to about 20 wt % of an alkylammonium hydroxide including tetramethylammonium hydroxide, tetraethylammonium hydroxide, tetrabutylammonium hydroxide, or tetrapropylammonium hydroxide;
about 1 wt % to about 30 wt % of an amine compound including 1-amino-2-propanol, 2-amino-1-butanol, N-methylethanolamine, diethylenetriamine, or triethanolamine;
about 0.01 wt % to about 0.2 wt % of a nonionic surfactant including both a hydrophobic group and a hydrophilic group including polyoxyethylene phenyl ether, polyoxyethylene beta-naphthyl ether, polyoxyethylene 2-ethylhexyl ether, polyoxyethylene decyl ether, polyoxyethylene lauryl ether, or polyoxyethylene oleyl ether; and
water,
all wt % being based on a total weight of the silicon layer etchant composition, wherein the composition has a pH of 11 to 14.

2. A method of forming a pattern, the method comprising:
forming a dummy gate by etching a silicon layer on a substrate;
forming an insulating layer to partially surround the dummy gate;
removing the dummy gate by using the silicon layer etchant composition as claimed in claim 1; and
forming a gate structure in an opening obtained by the removing of the dummy gate.

3. The method as claimed in claim 2, wherein forming the gate structure includes forming a barrier pattern and a metal gate, which are sequentially stacked in the opening in this stated order, such that the barrier pattern includes a metal nitride.

4. A method of preparing the silicon layer etchant composition as claimed in claim 1, the method comprising:
preparing an additive mixture by mixing the amine compound with the nonionic surfactant including both a hydrophobic group and a hydrophilic group; and
mixing the additive mixture with an aqueous solution of the alkylammonium hydroxide.

* * * * *